United States Patent [19]

Edelman

[11] Patent Number: 5,365,180

[45] Date of Patent: Nov. 15, 1994

[54] METHOD FOR MEASURING CONTACT RESISTANCE

[75] Inventor: Ran Edelman, Cupertino, Calif.

[73] Assignee: National Semiconductor Corporation, Santa Clara, Calif.

[21] Appl. No.: 48,892

[22] Filed: Apr. 16, 1993

[51] Int. Cl.⁵ ............................................. G01R 31/26
[52] U.S. Cl. .................................. 324/715; 324/713; 324/158.1
[58] Field of Search ............ 324/713, 715, 719, 158 P, 324/158 R

[56] References Cited

U.S. PATENT DOCUMENTS

| | | | |
|---|---|---|---|
| 3,996,514 | 12/1976 | Brown et al. | 324/158 P |
| 4,175,253 | 11/1979 | Pitegoff | 324/713 |
| 4,336,496 | 6/1982 | Schnabl et al. | 324/158 P |
| 5,239,270 | 8/1993 | Desbiens | 324/719 |

FOREIGN PATENT DOCUMENTS 0170933  7/1988  Japan ................................. 324/158 P

*Primary Examiner*—Maura K. Regan
*Attorney, Agent, or Firm*—Hickman & Beyer

[57] ABSTRACT

An improved method for measuring contact resistance during device testing is disclosed. After a device under text has been properly positioned to make a contact with a test fixture, a first test current is forced between two pins of the device under test through an isolating diode and the voltage drop associated therewith is measured. Then, a second test current is forced to take the same path and the voltage drop associated therewith is also measured. The values of the forced currents and the measured voltage drops are then used to determine the dynamic resistance of the path, which includes the resistance of two contacts. The determined dynamic resistance or a derivative thereof is then used as an indication of the contact resistance between the test fixture and the device under test.

8 Claims, 4 Drawing Sheets

METHOD FOR MEASURING CONTACT RESISTANCE

BACKGROUND OF THE INVENTION

The present invention relates generally to wafer probe tests. More particularly, an improved method of determining the contact resistance between a probe card and a device under test during a wafer probe test is disclosed.

Integrated circuits (ICs) are typically fabricated by groups on wafers. After the fabrication has been completed, each of the ICs must be tested to insure that it works properly. This is typically accomplished using a test head that includes a probe card. The probe card has a multiplicity of probe contacts that are designed to engage the pins of a selected one of the integrated circuits (ICs). During testing, the probe is positioned over a wafer such that the probe contacts contact the pins of a selected chip on the wafer. A test program is then executed to determine whether the chip performs satisfactorily.

One problem frequently encountered during testing is the failure to make a good contact between the probe contacts and the IC pins. If a good contact is not made, there is a risk that a perceived failure will be the result of a poor contact rather than due to an actual defect in the chip. In single pass testing of state of the art ICs, using conventional testing equipment and conventional testing techniques, it is not uncommon to have chips fail due to poor contacts.

In order to address this problem, it is common to at least periodically attempt to measure the contact resistance during testing. If such tests reveal that the contact is getting bad, appropriate measures are taken to remedy the problem. By analyzing the contact resistance tests results, engineers can develop guidelines as to how often the probers should be cleaned during testing, and can see the development of other problems such as the buildup of contamination on the probe contacts.

The most common method of calculating the contact resistance is to force a designated current through the diode that is typically present between the device pin and the ground (or power supply). The voltage drop associated with the forced current is then measured. If a bad contact exists, the voltage drop will increase. In practice, such measurements measure the resistance of two contacts in addition to the internal resistance of the device. In cases where the contact is checked by forcing current between the device pin and ground, the internal resistance may take the form of the resistance of the internal supply lines and the resistance of the diode. In such a circuit, the internal resistance may be on the order of 5–1000 ohms and the contact resistance of a good pair of connections may be on the order of 0.1–5 ohms. On the other hand, the contact resistance of a pair of bad connection may be on the order of 5–50 or more ohms. A typical forced current is on the order of 0.1–10 milliamps and up. Thus, the expected voltage drop may be on the order of 0.5–1.5 volts. Thus, the total resistance measured may be on the order of 50 ohms and up, while the differential resistance to be measured (that is the variations in contact resistance) may be on the order of 1 to 100 ohms and up (depending on the device technology etc.). Of course, these numbers may vary a great deal in accordance with the devices being tested. Accordingly, it is difficult to analyze the "contact resistance data" since the resolution is necessarily poor.

SUMMARY OF THE INVENTION

Accordingly, it is an object of the invention to provide an improved method of determining the contact resistance between a test fixture and the contacted pins of a device under test in order to facilitate good control of the testing operation.

To achieve the foregoing and other objects and in accordance with the purpose of the present invention, an improved method for measuring contact resistance during device testing is disclosed. Initially, a device under test is positioned in the test fixture such that there is a contact to the desired pins of the device under test. A first test current is then forced between two pins of the device under test through an isolating diode and the voltage drop associated therewith is measured. Then, a second test current is forced to take the same path and the voltage drop associated therewith is also measured. The values of the forced currents and the measured voltage drops are then used to determine the dynamic resistance of the path, which includes the resistance of two contacts. The determined dynamic resistance or a derivative thereof is then used as an indication of the contact resistances between the test fixture and the device under test.

The dynamic resistance may be calculated by dividing the differential measured voltage by the differential forced current. In a preferred embodiment, the resistance of the contacts is determined by subtracting a predetermined resistance indicative of the internal resistance of the contact resistance test path in the device under test, from the calculated dynamic resistance.

The described method may repeated a multiplicity of times to test a multiplicity of devices. The information obtained therefrom may be used for a variety of purposes useful to test engineers such as determining the appropriate test fixture cleaning intervals. One useful method of presenting the information is to plot a graph which shows the calculated contact resistance verses the number of tests conducted on a particular wafer.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

To overcome the drawbacks of the prior art as described in the background section of the application, the present invention contemplates forcing two current levels through the diode between a selected pin and the ground, a power supply or another device pin. The corresponding voltage drop associated with each forced current is then measured. Using these measurements, the dynamic resistance of the test path is calculated rather than a static resistance. That is, the dynamic resistance $R_D$ is calculated by dividing the differential voltage drop by the differential forced current. This may be calculated using the following formula:

$$R_D = (V1 - V2)/(I1 - I2)$$

The internal resistance of the diode and the supply lines will be substantially constant between devices formed on the same wafer, as well as between devices formed on different wafers. Therefore, variations in the dynamic resistance calculations can be considered to substantially reflect differences in the contact resistance. That is, the contact resistance ($R_c$) can be calculated by subtracting a predetermined (known) internal resistance ($R_I$) of the test path from the calculated dynamic resistance ($R_D$). That is:

$$R_C = R_D - R_I$$

Figure 1:
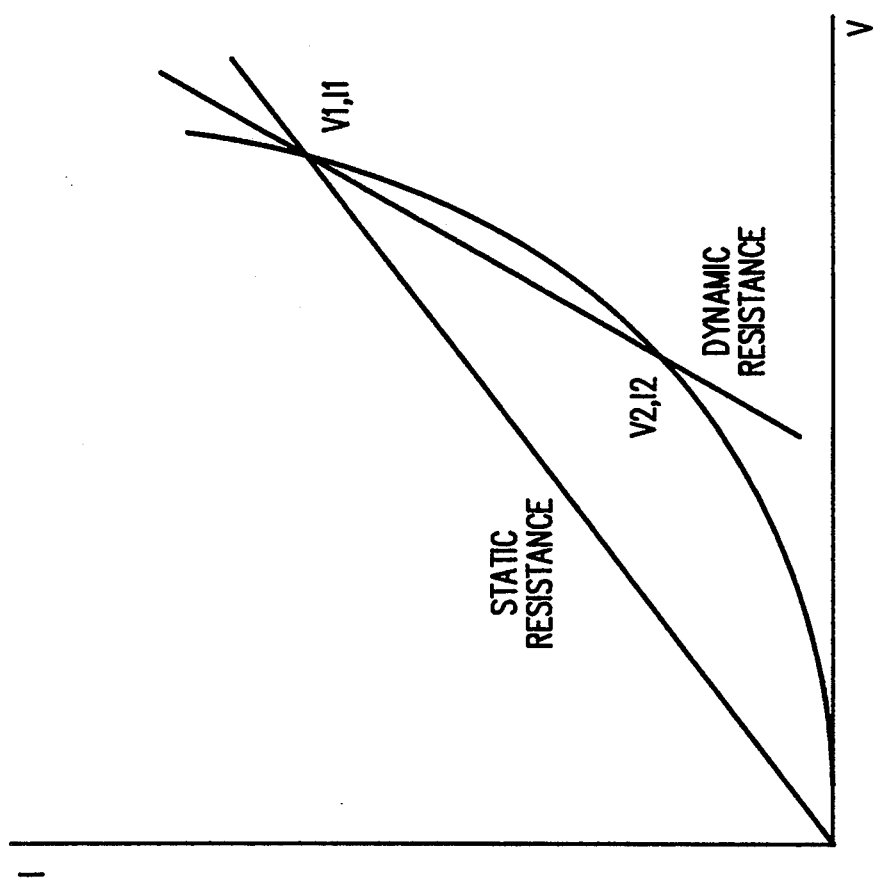
FIG. 1 is a graph showing a representative curve that illustrates the current verses voltage characteristics of a test path passing between two pins of a device under test through an isolating diode.

Since the dynamic resistance is used as the basis from which the contact resistance is calculated, the measurements are much more sensitive than conventional contact resistance testing methods. The reason for the improved sensitivity is best explained with reference to FIG. 1. As will be appreciated by those skilled in the art, the internal resistance of a diode is non-linear. Therefore, as seen in FIG. 1, the resistance of an ordinary test path is also non-linear. Thus, the voltage drop will not be directly proportional to the magnitude of the variations in the forced current. Rather, the current passed tends to increase exponentially as a function of the applied voltage. This feature is used advantageously in the present invention to improve the resolution of the resistance measurement.

Specifically, as seen in FIG. 1, when the static resistance is calculated, a single forced current (as for example I1) is used, we are attempting to determine variations of the contact resistances out of a relatively large total resistance measurement. On the other hand, when the dynamic resistance of the diode is calculated using appropriately selected values for the first and second forced currents (I1, I2), as seen in FIG. 1, the contact resistance being determined is taken from a substantially smaller total resistance measurement. Therefore, the resolution of the contact resistance measurements may be improved significantly.

Figure 2:
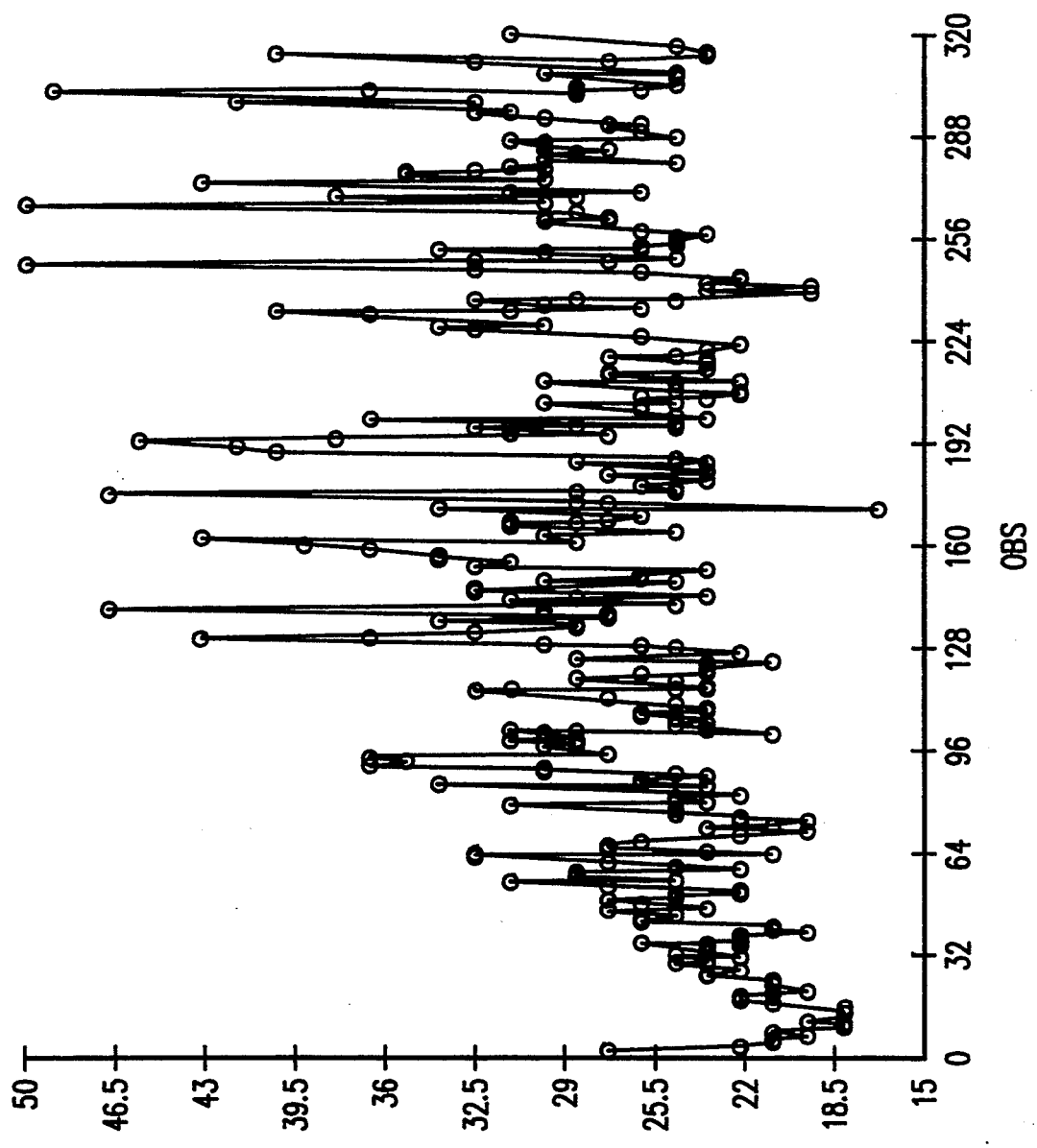
FIG. 2 is a graph showing the calculated resistance that was obtained during the testing of a wafer having approximately 300 ICs thereon, wherein the prober contacts were cleaned before testing began, but not during testing.
Figure 3:
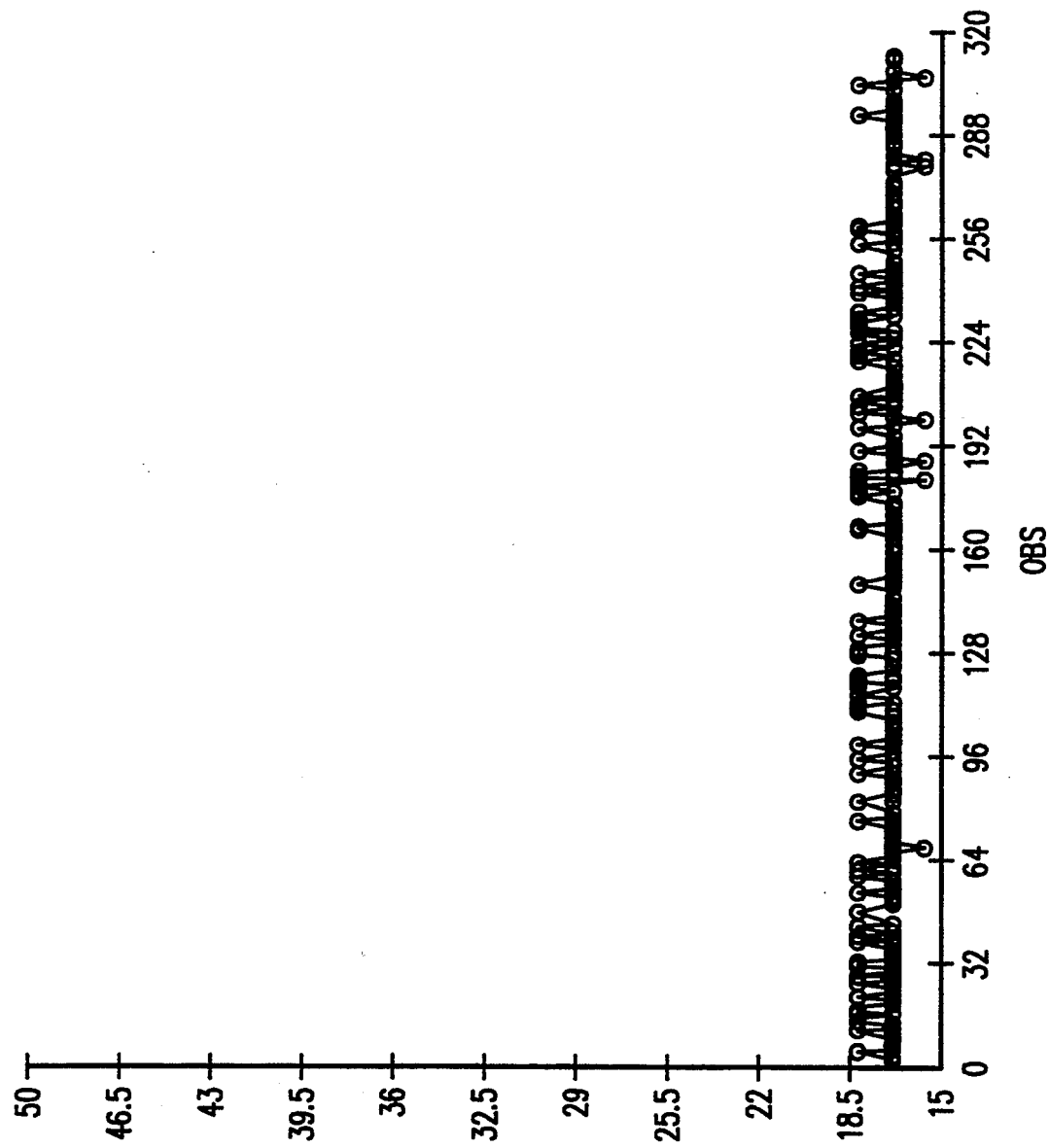
FIG. 3 is a graph showing the calculated resistance that was obtained during the testing of a wafer having approximately 300 ICs thereon, wherein the prober contacts were cleaned before testing began and after every 100 ICs were tested.
Figure 4:
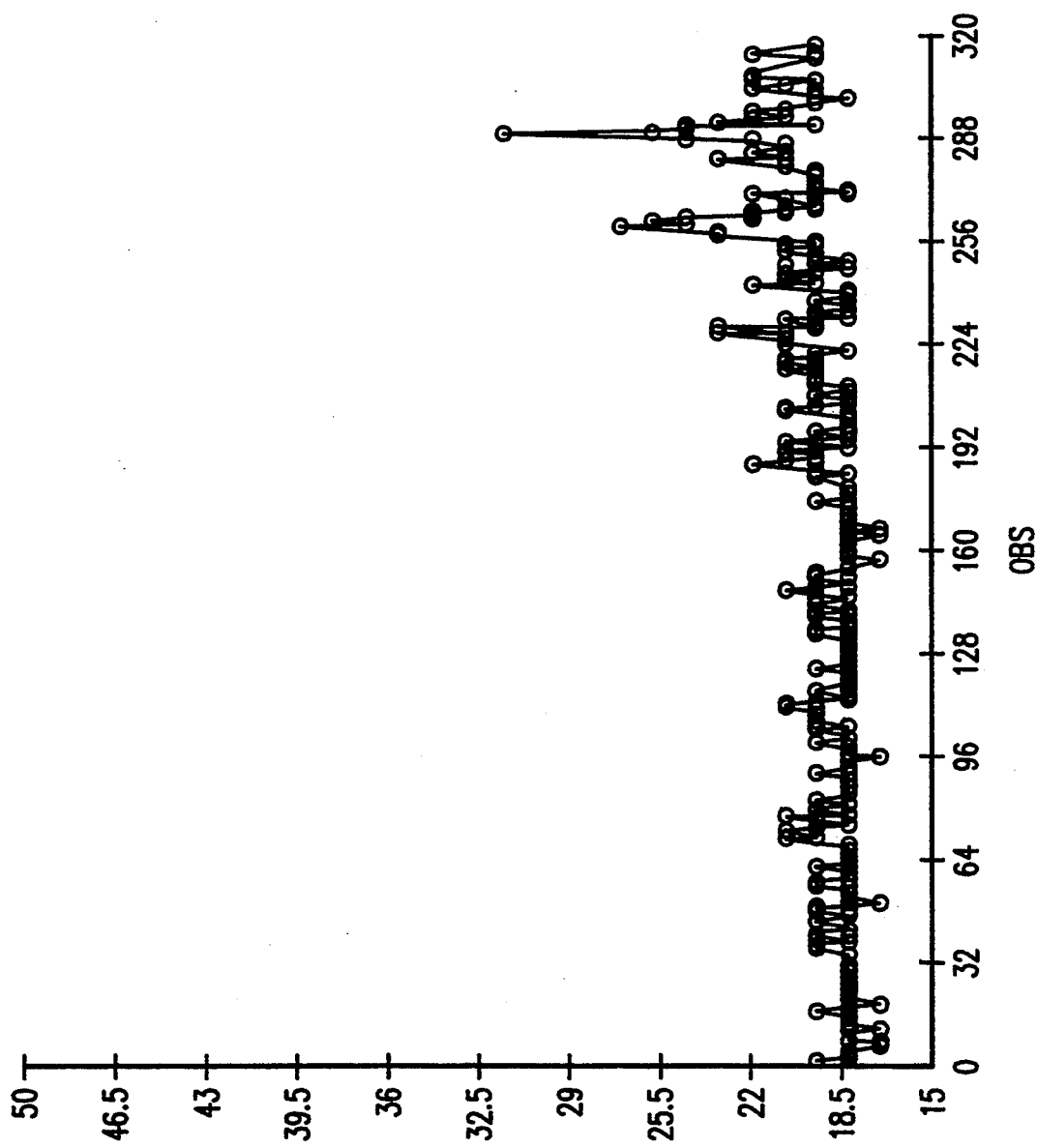
FIG. 4 is a graph showing the calculated resistance that was obtained during the testing of a wafer having approximately 300 ICs thereon, wherein the prober contacts were neither cleaned before testing began nor during testing.

Referring next to FIGS. 2–4, certain experimental results originating from actual wafer probe tests will be described. Initially, FIG. 2 shows a graph which plots the calculated resistance $R_C$ (in ohms) verses the number of ICs tested. In this experiment, 305 ICs that were formed a single selected wafer were tested. The probe contacts were cleaned before testing. They were not, however, cleaned at all during the testing. Rather, all 305 chips were tested sequentially. As can be seen from the graph, somewhere in the neighborhood of after 175 tests, the contact resistance began to increase. This is believed to be due to the collection of contamination on the probe contacts.

By reviewing these results, the test engineer can clearly see that the accumulation of contamination on the probe contacts had statistically begun to deteriorate the quality of the contact between the probe and the wafer. Thus, the engineer can take appropriate measures to eliminate these problems. In the described case, this would probably induce the test engineer to require more frequent cleaning of the probe contacts during the test sequence. However, the actual processing adjustments that are made will vary somewhat in accordance with the requirements of the tests being made.

Referring next to FIG. 3, a similar test was run wherein in addition to the cleaning of the probes that occurred before the testing began, the probe contact was also cleaned after every 100 ICs were tested. (In this example, a total of 297 ICs were tested). As would be expected, the contact resistance remained very steady over the course of testing.

On the other hand, FIG. 4 plots the results of another similar test that was conducted using relatively "dirty" probe contacts without any cleaning. As can be seen therein, the plotted contact resistance show rather clearly that poor contacts are being formed and that there is a problem that should be addressed. The problem also seems to magnify as the testing proceeds, which is to be expected.

The described method has several advantages over the prior art. Most notably, the dynamic resistance measurement has substantially higher sensitivity then prior static resistance measurements. Further, the numerical results provided make it easy to analyze the experimental results obtained in the contact resistance test.

By providing a method of rather readily and accurately measuring contact resistance during device testing, test engineers are given a valuable tool which can be used to determine what measures are required to prevent contact resistance from adversely affecting test accuracy, as well as determining whether the selected testing procedures are working well. One very common problem is determining how often the test fixture (i.e probe contact in wafer sort testing) should be cleaned during testing. The described invention gives the test engineer very good quality control information concerning the contact resistance. By using the information provided, appropriate maintenance intervals can be determined.

In addition to maintenance, the described method can be used to detect the deterioration of the test fixture which may require repair, cleaning, replacement, etc. Other contact resistance related problems that can be detected using the described method include misalignment.

The described invention can be readily embodied in software algorithms that are incorporated into virtually any existing testing equipment. It is noted that contact resistance problems encountered in practice tend to increase as the pin count and the test frequency increase. Therefore, the invention is particularly valuable when it is used in conjunction with the testing with high speed and large chip test heads. The invention may be applied to the testing of both silicon and gallium-arsenide based chip, to chips of any size and to packaged and non-packaged chips.

Although only one embodiment of the present invention has been described, it should be understood that the present invention may be embodied in many other specific forms without departing from the spirit or scope of the invention. Therefore, the present examples are to be considered as illustrative and not restrictive, and the invention is not to be limited to the details given herein, but may be modified within the scope of the appended claims.

I claim:

1. A method for measuring contact resistance between a test fixture and a device under test during device testing, the method comprising the steps of:

positioning one of a device under test and a test fixture relative to the other to establish an electrical contact;

forcing a first test current between two pins of the device under test through an isolating diode and measuring a first voltage drop associated therewith;

forcing a second test current between said two pins of the device under test through said isolating diode and measuring a second voltage drop associated therewith, said second test current having a different amperage than said first test current; and determining the dynamic resistance of the test path using the values of the forced currents and the measured voltage drops and using the determined dynamic resistance in the determination of the contact resistances between the test fixture and the device under test.

2. A method as recited in claim 1 wherein the dynamic resistance is calculated by dividing the differential measured voltage by the differential forced current.

3. A method as recited in claim 2 wherein the resistance of the contacts is determined by subtracting a predetermined resistance indicative of the internal resistance of the device under test from the calculated dynamic resistance.

4. A method as recited in claim 1 wherein the device under test is a wafer.

5. A method as recited in claim 4 wherein the method is repeated a multiplicity of times to test a multiplicity of devices formed on a single wafer.

6. A method as recited in claim 4 wherein the method is repeated a multiplicity of times to test a multiplicity of devices formed on a single wafer and the results are plotted on a graph which shows the calculated contact resistance verses the number of tests conducted.

7. A method as recited in claim 1 wherein the determined indication of the contact resistances between the test fixture and the device under test is used to determine the appropriate test fixture maintenance intervals.

8. A method as recited in claim 1 wherein the determined indication of the contact resistances between the test fixture and the device under test is used to determine when prober contacts in the test fixture need to be one of replaced, cleaned, repaired or aligned.

* * * * *